United States Patent
Hong

(10) Patent No.: US 12,293,990 B2
(45) Date of Patent: May 6, 2025

(54) SEMICONDUCTOR INTEGRATED CIRCUIT COMPRISING MASTER CHIP WITH FIRST BUFFER CIRCUIT AND SLAVE CHIIP WITH SECOND BUFFER CIRCUIT

(71) Applicant: SK hynix Inc., Icheon-si (KR)

(72) Inventor: Yun Gi Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 508 days.

(21) Appl. No.: 17/700,965

(22) Filed: Mar. 22, 2022

(65) Prior Publication Data

US 2023/0112669 A1    Apr. 13, 2023

(30) Foreign Application Priority Data

Sep. 30, 2021    (KR) .................. 10-2021-0130334

(51) Int. Cl.
*H01L 25/065* (2023.01)
*H01L 23/48* (2006.01)
*H03K 3/3562* (2006.01)

(52) U.S. Cl.
CPC ........ *H01L 25/0657* (2013.01); *H01L 23/481* (2013.01); *H03K 3/35625* (2013.01); *H01L 2225/06513* (2013.01)

(58) Field of Classification Search
CPC ..... G11C 5/063; G11C 5/147; H01L 25/0657; H01L 25/18; H01L 2225/06565; H01L 23/481; H01L 2225/06541
See application file for complete search history.

(56) References Cited

U.S. PATENT DOCUMENTS

| 8,913,443 | B2 | 12/2014 | Pyeon | |
|---|---|---|---|---|
| 9,666,262 | B2* | 5/2017 | Kim | H10B 12/09 |
| 2011/0109382 | A1* | 5/2011 | Jin | G11C 5/063 |
| | | | | 257/621 |
| 2013/0162343 | A1* | 6/2013 | Byeon | H01L 25/0657 |
| | | | | 327/564 |
| 2014/0232429 | A1* | 8/2014 | Riho | H03K 19/018521 |
| | | | | 326/30 |
| 2014/0233292 | A1* | 8/2014 | Kang | H01L 24/17 |
| | | | | 257/737 |
| 2016/0300818 | A1* | 10/2016 | Shim | G11C 29/025 |
| 2017/0154655 | A1* | 6/2017 | Seo | G11C 5/141 |

* cited by examiner

*Primary Examiner* — Mamadou L Diallo

(57) ABSTRACT

Disclosed is a semiconductor integrated circuit comprising a master chip including a first buffer circuit coupled to a first power line that is supplied with a first voltage and a first supply circuit that supplies a second voltage, having a lower voltage level than the first voltage, to a first through line in response to a control signal, and a slave chip, coupled to the first through line, including a second buffer circuit coupled to a second power line supplied with the second voltage and a second supply circuit that supplies the second voltage to a second through line in response to the control signal, which indicates whether the master chip and the slave chip are stacked.

16 Claims, 4 Drawing Sheets

SEMICONDUCTOR INTEGRATED CIRCUIT COMPRISING MASTER CHIP WITH FIRST BUFFER CIRCUIT AND SLAVE CHIIP WITH SECOND BUFFER CIRCUIT

CROSS-REFERENCE TO RELATED APPLICATION(S)

This application claims priority under 35 U.S.C. § 119 to Korean Patent Application No. 10-2021-0130334, filed on Sep. 30, 2021 in the Korean Intellectual Property Office, the disclosure of which is incorporated herein by reference in its entirety.

BACKGROUND

1. Field

Various embodiments of the present disclosure relate to a semiconductor design technique, and more particularly, to a semiconductor integrated circuit having a stacked structure.

2. Description of the Related Art

Packaging technology for semiconductor integrated circuits has been continuously developed to satisfy a demand for miniaturization and increased reliability. In recent years, various technologies for stacked packages have been developed as high performance and miniaturization are required of electric/electronic products.

The term "stack" in the semiconductor industry refers to piling up two or more semiconductor chips or packages vertically. According to such a stacked package, for example, in the case of a semiconductor memory device, it is possible to realize a product having a memory capacity that is twice or more than the memory capacity that can be realized through a semiconductor integration process. In addition to the increase in memory capacity, the stacked package is advantageous in terms of packaging density and efficiency in use of packaging area. As a result, research and development on stacked packages is increasingly a priority.

A stacked package can be manufactured by a method of stacking individual semiconductor chips and then packaging the stacked semiconductor chips all at once, or a method of stacking packaged individual semiconductor chips. The individual semiconductor chips of the stacked package are electrically connected through a metal wire or a through silicon via. Specifically, in a stacked package using a through silicon via, semiconductor chips are physically and electrically connected with each other in a vertical direction through the through silicon via, which is formed in the inside of a semiconductor chip.

SUMMARY

Various embodiments of the present disclosure are directed to a semiconductor integrated circuit for supplying a relatively low voltage to an unused first circuit.

In addition, various embodiments of the present disclosure are directed to a semiconductor integrated circuit for continuously supplying the voltage to a second circuit using the voltage.

In accordance with an embodiment, a semiconductor integrated circuit may include: a master chip including a first buffer circuit coupled to a first power line that is supplied with a first voltage and a first supply circuit that supplies a second voltage, having a lower voltage level than the first voltage, to a first through line in response to a control signal; and a slave chip, coupled to the first through line, including a second buffer circuit coupled to a second power line supplied with the second voltage and a second supply circuit that supplies the second voltage to a second through line in response to the control signal, which indicates whether the master chip and the slave chip are stacked.

In accordance with an embodiment, a semiconductor integrated circuit may include: a master chip that performs a predetermined operation using a first voltage and that supplies a second voltage having a lower voltage level than the first voltage to a first through line; and a slave chip, coupled to the first through line, that uses the second voltage during a period in which the predetermined operation is performed.

DETAILED DESCRIPTION

Various embodiments of the present disclosure are described below with reference to the accompanying drawings, in order to describe in detail the present disclosure so that those with ordinary skill in art to which the present disclosure pertains may easily carry out the technical spirit of the present disclosure.

It will be understood that when an element is referred to as being "connected to" or "coupled to" another element, the element may be directly connected to or coupled to the other element, or electrically connected to or coupled to the other element with one or more elements interposed therebetween. In addition, it will also be understood that the terms "comprises," "comprising," "includes," and "including", when used in this specification, do not preclude the presence of one or more other elements, but may further include or have the one or more other elements, unless mentioned otherwise. In the descriptions throughout the specification, some components are described in singular forms, but the present disclosure is not limited thereto, and it will be understood that components may be formed or provided in plural.

Figure 1:
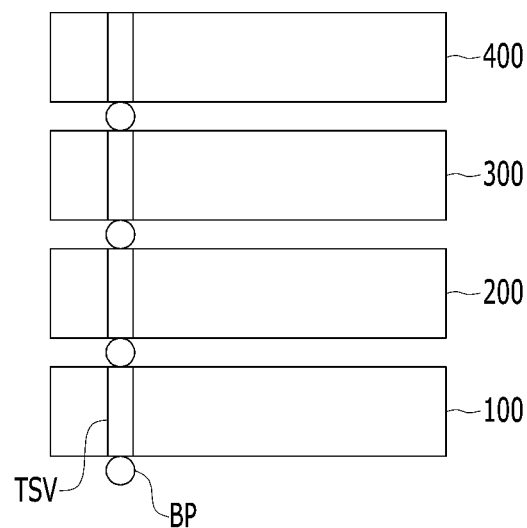
FIG. 1 is a block diagram illustrating a semiconductor integrated circuit in accordance with an embodiment of the disclosure.

FIG. 1 is a block diagram illustrating a semiconductor integrated circuit in accordance with an embodiment of the disclosure.

Referring to FIG. 1, a semiconductor integrated circuit may include first to fourth semiconductor chips 100, 200, 300 and 400. Although the semiconductor integrated circuit in FIG. 1 includes the first to fourth semiconductor chips 100, 200, 300 and 400, the present disclosure is not limited thereto, and in other embodiments a semiconductor integrated circuit may include three or less semiconductor chips or five or more semiconductor chips.

The first to fourth semiconductor chips 100, 200, 300 and 400 may be vertically stacked. The first to fourth semiconductor chips 100, 200, 300 and 400 may be coupled to one another through at least one bump pad BP and at least one through line TSV. The bump pad BP and the through line TSV may be directly or indirectly coupled. The through line TSV may vertically penetrate each of the semiconductor chips 100, 200, 300 and 400. The through line TSV may be a through silicon via.

Only one of the first to fourth semiconductor chips 100, 200, 300 and 400 may be electrically coupled to an external device, such as for example, a controller. For example, the first semiconductor chip 100 disposed at the bottom of the stacked first to fourth semiconductor chips 100, 200, 300 and 400 may be coupled to the external device. Hereinafter, the first semiconductor chip 100 coupled to the external device is referred to as a "master chip", and each of the second to fourth semiconductor chips 200, 300 and 400 coupled to the external device via the master chip is referred to as a "slave chip". All of the slave chips 200, 300 and 400 may have the same configuration, so only one slave chip 200 is representatively described below.

Figure 2:
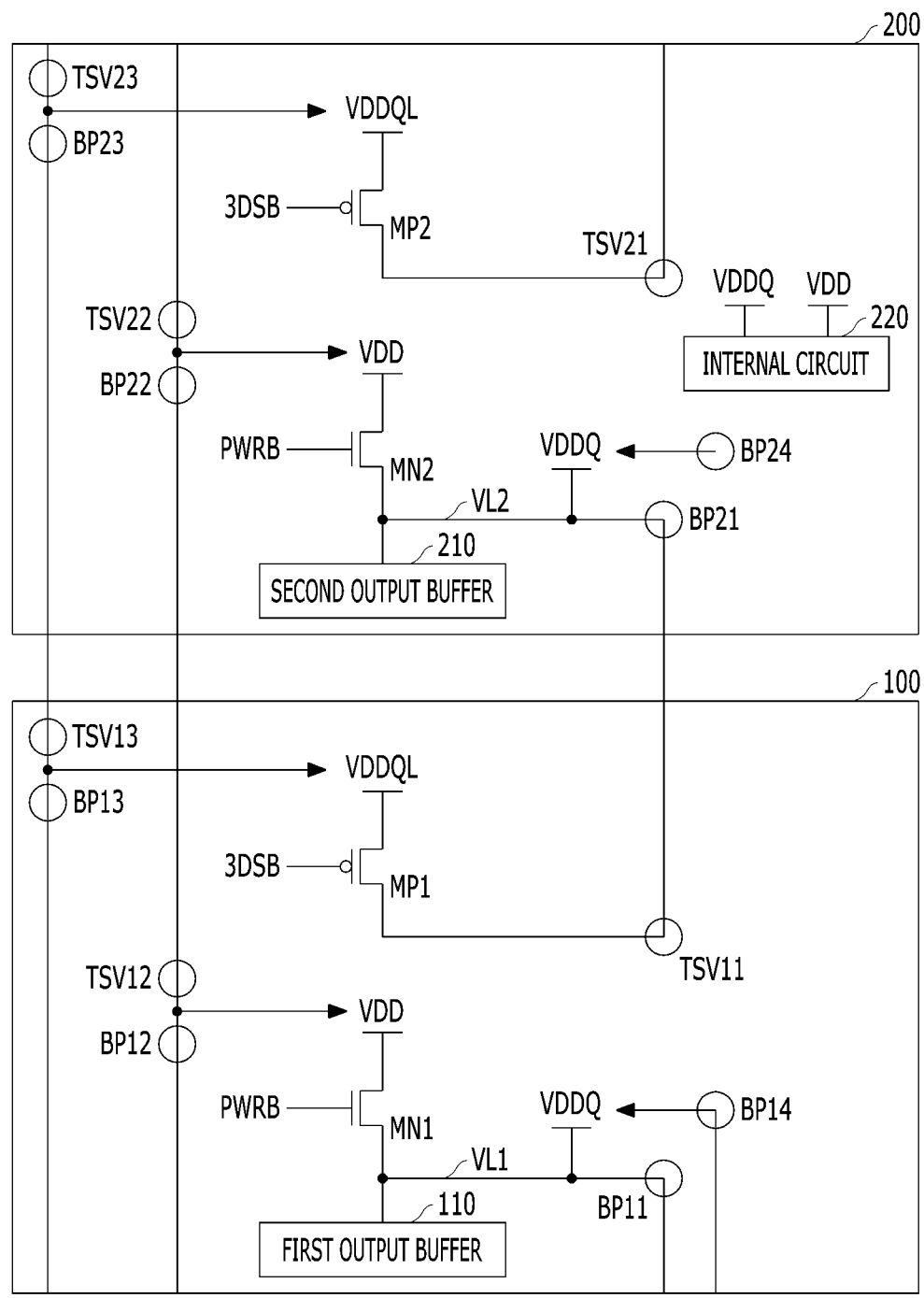
FIG. 2 is a block diagram illustrating an example of master and slave chips illustrated in FIG. 1.

FIG. 2 is a block diagram illustrating an example of master and slave chips illustrated in FIG. 1.

Referring to FIG. 2, a master chip 100 may include a first output buffer (i.e., a first buffer circuit) 110, a first driving circuit MN1 and a first supply circuit MP1.

The first output buffer 110 may be coupled to a first power line VL1, which is supplied with a first voltage VDDQ. The first voltage VDDQ, which is an exclusive voltage for the first output buffer 110, may be an external voltage supplied from an external device. The first voltage VDDQ may be supplied to the master chip 100 through a fourth bump pad BP14. A first bump pad BP11 may be in a floating state in which no voltage is supplied from the external device. The first power line VL1 may receive the first voltage VDDQ through the fourth bump pad BP14 even though the first bump pad BP11 is in the floating state.

The first output buffer 110 may perform a predetermined operation using the first voltage VDDQ. For example, the first output buffer 110 may output data to the external device by using the first voltage VDDQ. The data may be a signal generated by the master chip 100 and/or the slave chip 200.

The first driving circuit MN1 may selectively supply a third voltage VDD to the first power line VL1 in response to a power-up signal PWRB. In other words, the first driving circuit MN1 may drive the first power line VL1 with the third voltage VDD during a power-up period. For example, the first driving circuit MN1 may include an NMOS transistor. The NMOS transistor may have a gate terminal receiving the power-up signal PWRB, and a source terminal and a drain terminal coupled between a supply terminal of the third voltage VDD and the first power line VL1. The power-up period may refer to an initial ramp-up period of the first voltage VDDQ. The first driving circuit MN1 may increase driving power of the first voltage VDDQ by using the third voltage VDD during the power-up period.

The third voltage VDD may have the same voltage level as the first voltage VDDQ. The third voltage VDD may be supplied from the external device, and may be supplied to the master chip 100 through a second bump pad BP12. The third voltage VDD may be supplied to the slave chip 200 through a second through line TSV12.

The first supply circuit MP1 may supply a second voltage VDDQL to a first through line TSV11 in response to a control signal 3DSB. For example, the first supply circuit MP1 may include a PMOS transistor. The PMOS transistor may have a gate terminal receiving the control signal 3DSB, and a source terminal and a drain terminal coupled between a supply terminal of the second voltage VDDQL and the first through line TSV11. The control signal 3DSB may be a signal indicating whether the semiconductor chips are stacked. Since the semiconductor integrated circuit has a structure in which the master chip 100 and the slave chip 200 are stacked on each other, the control signal 3DSB may be in an activated state. The control signal 3DSB may be provided from the external device or may be generated by the master chip 100.

The second voltage VDDQL may have a lower voltage level than the first voltage VDDQ. The second voltage VDDQL may be supplied from the external device, and may be supplied to the master chip 100 through a third bump pad BP13. The second voltage VDDQL may be supplied to the slave chip 200 through a third through line TSV13.

The slave chip 200 may include a second output buffer (i.e., a second buffer circuit) 210, a second driving circuit MN2, a second supply circuit MP2 and an internal circuit 220.

The second output buffer 210 may be coupled to a second power line VL2, to which the second voltage VDDQL is supplied. The second voltage VDDQL may be supplied from the master chip 100. The second voltage VDDQL may be supplied to the slave chip 200 through a first bump pad BP21. A fourth bump pad BP24 may be in a floating state because it is electrically decoupled from the fourth bump pad BP14 of the master chip 100. Although the fourth bump pad BP24 is in the floating state, the second power line VL2 may receive the second voltage VDDQL through the first bump pad BP21.

The second output buffer 210 may be an unused circuit due to characteristics of the slave chip 200. In other words, since the slave chip 200 is not directly coupled to the external device, the second output buffer 210 may be disabled. Since the second output buffer 210 receives the second voltage VDDQL, which has a lower voltage level than the first voltage VDDQ, a leakage current generated by the second output buffer 210 may be reduced. Data generated by the slave chip 200 may be transferred to the first output buffer 110 of the master chip 100 through a predetermined path (not illustrated).

The second driving circuit MN2 may selectively supply the third voltage VDD to the second power line VL2 in response to a power-up signal PWRB. In other words, the second driving circuit MN2 may drive the second power line VL2 with the third voltage VDD during the power-up period. For example, the second driving circuit MN2 may include an NMOS transistor. The NMOS transistor may have a gate terminal receiving the power-up signal PWRB, and a source terminal and a drain terminal coupled between a supply terminal of the third voltage VDD and the second power line VL2. The power-up period may refer to an initial ramp-up period of the first voltage VDDQ. The second driving circuit MN2 may increase driving power of the second voltage VDDQL by using the third voltage VDD during the power-up period.

The third voltage VDD may be supplied from the master chip 100, and may be supplied to the slave chip 200 through a second bump pad BP22. The third voltage VDD may be supplied to another slave chip, for example, 300, through a second through line TSV22.

The second supply circuit MP2 may supply the second voltage VDDQL to a first through line TSV21 in response to a control signal 3DSB. For example, the second supply circuit MP2 may include a PMOS transistor. The PMOS transistor may have a gate terminal receiving the control signal 3DSB, and a source terminal and a drain terminal coupled between a supply terminal of the second voltage VDDQL and the first through line TSV21. The control signal 3DSB may be a signal indicating whether the semiconductor chips are stacked. Since the semiconductor integrated circuit has a structure in which the master chip 100 and the slave chip 200 are stacked on each other, the control signal 3DSB may be in an activated state. The control signal 3DSB may be provided from the external device through the master chip 100 or may be generated by the slave chip 200.

The second voltage VDDQL may be supplied from the master chip 100, and supplied to the slave chip 200 through a third bump pad BP23. The second voltage VDDQL may be supplied to another slave chip, for example, 300, through a third through line TSV23.

The internal circuit 220 may be a circuit that performs domain crossing of voltages between circuits using different voltages. In the case of the slave chip 200, the second voltage VDDQL may be supplied to a supply terminal of the first voltage VDDQ through the second power line VL2. The internal circuit 220 may be coupled to the supply terminal of the first voltage VDDQ and the supply terminal of the third voltage VDD, and shift a voltage level of a signal from a domain of the first voltage VDDQ having a relatively low voltage level to a domain of the third voltage VDD having a relatively high voltage level.

Figure 3:
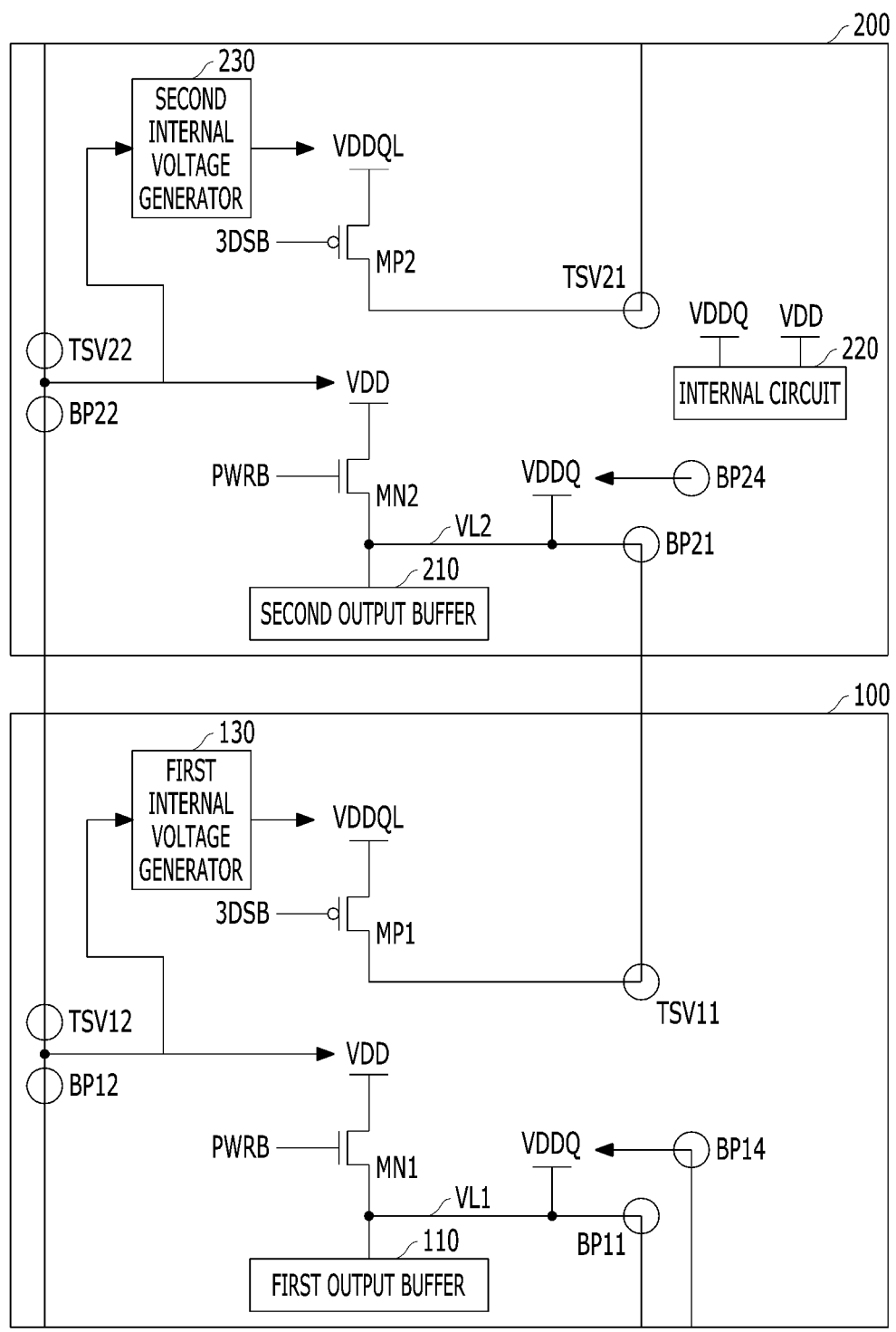
FIG. 3 is a block diagram illustrating another example of master and slave chips illustrated in FIG. 1.

FIG. 3 is a block diagram illustrating another example of master and slave chips illustrated in FIG. 1.

Referring to FIG. 3, a master chip 100 may include a first output buffer 110, a first driving circuit MN1, a first supply circuit MP1 and a first internal voltage generator 130.

The first output buffer 110 may be coupled to a first power line VL1, which is supplied with a first voltage VDDQ. The first voltage VDDQ, which is an exclusive voltage for the first output buffer 110, may be an external voltage supplied from an external device. The first voltage VDDQ may be supplied to the master chip 100 through a fourth bump pad BP14. A first bump pad BP11 may be in a floating state in which no voltage is supplied from the external device. The first power line VL1 may receive the first voltage VDDQ through the fourth bump pad BP14 even though the first bump pad BP11 is in the floating state.

The first output buffer 110 may perform a predetermined operation using the first voltage VDDQ. For example, the first output buffer 110 may output data to the external device by using the first voltage VDDQ. The data may be a signal generated by the master chip 100 and/or the slave chip 200.

The first driving circuit MN1 may selectively supply a third voltage VDD to the first power line VL1 in response to a power-up signal PWRB. In other words, the first driving circuit MN1 may drive the first power line VL1 with the third voltage VDD during a power-up period. For example, the first driving circuit MN1 may include an NMOS transistor. The NMOS transistor may have a gate terminal receiving the power-up signal PWRB, and a source terminal and a drain terminal coupled between a supply terminal of the third voltage VDD and the first power line VL1. The power-up period may refer to an initial ramp-up period of the first voltage VDDQ. The first driving circuit MN1 may increase driving power of the first voltage VDDQ by using the third voltage VDD during the power-up period.

The third voltage VDD may have the same voltage level as the first voltage VDDQ. The third voltage VDD may be supplied from the external device, and may be supplied to the master chip 100 through a second bump pad BP12. The third voltage VDD may be supplied to the slave chip 200 through a second through line TSV12.

The first supply circuit MP1 may supply a second voltage VDDQL to a first through line TSV11 in response to a control signal 3DSB. For example, the first supply circuit MP1 may include a PMOS transistor. The PMOS transistor may have a gate terminal receiving the control signal 3DSB, and a source terminal and a drain terminal coupled between a supply terminal of the second voltage VDDQL and the first through line TSV11. The control signal 3DSB may be a signal indicating whether the semiconductor chips are stacked. Since the semiconductor integrated circuit has a structure in which the master chip 100 and the slave chip 200 are stacked on each other, the control signal 3DSB may be in an activated state. The control signal 3DSB may be provided from the external device or may be generated by the master chip 100.

The first internal voltage generator 130 may generate the second voltage VDDQL in response to the third voltage VDD. The second voltage VDDQL may have a lower voltage level than the first voltage VDDQ. For example, the first internal voltage generator 130 may include a low-dropout voltage regulator.

The slave chip 200 may include a second output buffer 210, a second driving circuit MN2, a second supply circuit MP2, a second internal voltage generator 230 and an internal circuit 220.

The second output buffer 210 may be coupled to a second power line VL2, to which the second voltage VDDQL is supplied. The second voltage VDDQL may be supplied from the master chip 100. The second voltage VDDQL may be supplied to the slave chip 200 through a first bump pad BP21. A fourth bump pad BP24 may be in a floating state because it is electrically decoupled from the fourth bump pad BP14 of the master chip 100. Although the fourth bump pad BP24 is in the floating state, the second power line VL2 may receive the second voltage VDDQL through the first bump pad BP21.

The second output buffer 210 may be an unused circuit due to characteristics of the slave chip 200. In other words, since the slave chip 200 is not directly coupled to the external device, the second output buffer 210 may be disabled. Since the second output buffer 210 receives the second voltage VDDQL, which has a lower voltage level than the first voltage VDDQ, a leakage current generated by the second output buffer 210 may be reduced. Data generated by the slave chip 200 may be transferred to the first output buffer 110 of the master chip 100 through a predetermined path (not illustrated).

The second driving circuit MN2 may selectively supply the third voltage VDD to the second power line VL2 in response to a power-up signal PWRB. In other words, the second driving circuit MN2 may drive the second power line VL2 with the third voltage VDD during the power-up period. For example, the second driving circuit MN2 may include an NMOS transistor. The NMOS transistor may have a gate terminal receiving the power-up signal PWRB, and a source terminal and a drain terminal coupled between a supply terminal of the third voltage VDD and the second power line VL2. The power-up period may refer to an initial ramp-up period of the first voltage VDDQ. The second driving circuit MN2 may increase driving power of the second voltage VDDQL by using the third voltage VDD during the power-up period.

The third voltage VDD may be supplied from the master chip 100, and may be supplied to the slave chip 200 through a second bump pad BP22. The third voltage VDD may be supplied to another slave chip, for example, 300, through a second through line TSV22.

The second supply circuit MP2 may supply the second voltage VDDQL to a first through line TSV21 in response to a control signal 3DSB. For example, the second supply circuit MP2 may include a PMOS transistor. The PMOS transistor may have a gate terminal receiving the control signal 3DSB, and a source terminal and a drain terminal coupled between a supply terminal of the second voltage VDDQL and the first through line TSV21. The control signal 3DSB may be a signal indicating whether the semiconductor chips are stacked. Since the semiconductor integrated circuit has a structure in which the master chip 100 and the slave chip 200 are stacked on each other, the control signal 3DSB may be in an activated state. The control signal 3DSB may be provided from the external device through the master chip 100 or may be generated by the slave chip 200.

The second internal voltage generator 230 may generate the second voltage VDDQL in response to the third voltage VDD. The second voltage VDDQL may have a lower voltage level than the first voltage VDDQ. For example, the second internal voltage generator 230 may include the low-dropout voltage regulator.

The internal circuit 220 may be a circuit that performs domain crossing of voltages between circuits using different voltages. In the case of the slave chip 200, the second voltage VDDQL may be supplied to a supply terminal of the first voltage VDDQ through the second power line VL2. The internal circuit 220 may be coupled to the supply terminal of the first voltage VDDQ and the supply terminal of the third voltage VDD, and shift a voltage level of a signal from a domain of the first voltage VDDQ having a relatively low voltage level to a domain of the third voltage VDD having a relatively high voltage level.

Figure 4:
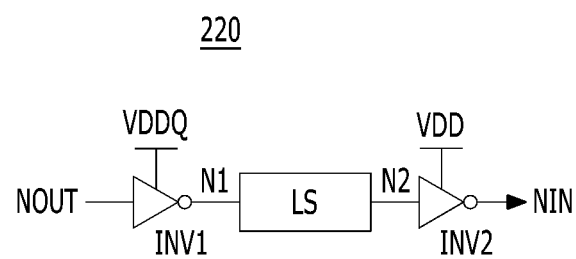
FIG. 4 is a block diagram illustrating an example of an internal circuit illustrated in FIGS. 2 and 3.

FIG. 4 is a block diagram illustrating an example of an internal circuit illustrated in FIGS. 2 and 3.

Referring to FIG. 4, an internal circuit 220 may include a first buffer INV1, a level shifter LS and a second buffer INV2.

The first buffer INV1 may buffer an output signal NOUT, which is generated from the domain of the first voltage VDDQ, by using the first voltage VDDQ.

The level shifter LS may generate a shifting signal N2 corresponding to a first buffering signal N1, which is outputted from the first buffer INV1. The shifting signal N2 may have a voltage level corresponding to the third voltage VDD.

The second buffer INV2 may buffer the shifting signal N2 by using the third voltage VDD, and generate an input signal NIN suitable for the domain of the third voltage VDD.

Hereinafter, in an embodiment of the disclosure, an operation of a semiconductor integrated circuit with the above-described configuration is described. The described semiconductor integrated circuit includes the master and slave chips 100 and 200 illustrated in FIG. 2.

The external device may sequentially supply the first to third voltages VDDQ, VDDQL and VDD to the master chip 100. For example, from among the first to third voltages VDDQ, VDDQL and VDD, the external device may preferentially supply the third voltage VDD. This takes advantage of the third voltage VDD already stabilized during the power-up period of the first voltage VDDQ.

The master chip 100 may transfer the second and third voltages VDDQL and VDD to the slave chip 200 through the second and third through lines TSV12 and TSV13, and transfer the second voltage VDDQL to the slave chip 200 through the first through line TSV11.

When the first voltage VDDQ is supplied from the external device, the master chip 100 may drive the first power line VL1 with the third voltage VDD during the power-up period so as to increase the driving power of the first voltage VDDQ. That is, the first voltage VDDQ may rapidly increase from an initial level to a target level. The master chip 100 may perform a predetermined operation during an operation period. For example, the first output buffer 110 may output data to the external device by using the first voltage VDDQ during a data output period.

The slave chip 200 may drive the second power line VL2 with the third voltage VDD during the power-up period so as to increase the driving power of the first voltage VDDQ. That is, the first voltage VDDQ may rapidly increase from the initial level to the target level. The second voltage VDDQL may be supplied to the supply terminal of the first voltage VDDQ through the first bump pad BP21 and the second power line VL2. The second output buffer 210 may be disabled during the data output period. Thus, as the second output buffer 210 receives the second voltage VDDQL having a relatively low voltage level, the leakage current generated by the second output buffer 210 may be reduced. In addition, the internal circuit 220 may normally operate by continuously receiving the second voltage VDDQL through the supply terminal of the first voltage VDDQ. For example, the internal circuit 220 may shift a voltage level of a signal from the domain of the second voltage VDDQL having a relatively low voltage level to the domain of the third voltage VDD having a relatively high voltage level.

According to an embodiment of the present disclosure, as a voltage having a relatively low voltage level is supplied to a slave chip, a leakage current generated by an output buffer included in the slave chip may be reduced, and an internal circuit included in the slave chip may operate normally.

According to an embodiment of the present disclosure, a relatively low voltage is supplied to an unused first circuit, which makes it possible to reduce a leakage current generated by the first circuit.

In addition, according to an embodiment of the present disclosure, a voltage is continuously supplied to a second circuit using voltage level shifting, which makes it possible to operate the second circuit normally.

While the present disclosure has been illustrated and described with respect to some embodiments, the disclosed embodiments are provided for descriptive purposes, and not intended to be restrictive or limiting of the disclosed technology. Further, it is noted that the present disclosure may be achieved in various ways through substitution, change, and modification that fall within the scope of the following claims, as those skilled in the art will recognize in light of the present disclosure.

What is claimed is:

1. A semiconductor integrated circuit comprising:
   a master chip including a first buffer circuit coupled to a first power line that is supplied with a first voltage and a first supply circuit that supplies a second voltage, having a lower voltage level than the first voltage, to a first through line in response to a control signal; and
   a slave chip, coupled to the first through line, including a second buffer circuit coupled to a second power line supplied with the second voltage and a second supply circuit that supplies the second voltage to a second through line in response to the control signal, which indicates whether the master chip and the slave chip are stacked.

2. The semiconductor integrated circuit of claim 1, wherein the first buffer circuit and the second buffer circuit have the same configuration.

3. The semiconductor integrated circuit of claim 1, wherein the first buffer circuit includes a first output buffer that receives the first voltage and outputs data to an external device, and the second buffer circuit includes a second output buffer that receives the second voltage.

4. The semiconductor integrated circuit of claim 1, wherein the slave chip further includes an internal circuit that performs domain crossing of voltages using the second voltage and a third voltage having a different voltage level from the second voltage.

5. The semiconductor integrated circuit of claim 4, wherein the internal circuit includes a level shifter.

6. The semiconductor integrated circuit of claim 4, wherein the third voltage has the same voltage level as the first voltage.

7. The semiconductor integrated circuit of claim 1, wherein the master chip further includes a first driving circuit that supplies a third voltage to the first power line during a power-up period in response to a power-up signal.

8. The semiconductor integrated circuit of claim 1, wherein the slave chip further includes a second driving circuit that supplies a third voltage to the second power line during a power-up period in response to a power-up signal.

9. A semiconductor integrated circuit comprising:
   a master chip that performs a predetermined operation using a first voltage, wherein the master chip includes a fire supply circuit that supplies a second voltage having a lower voltage level than the first voltage to a first through line; and
   a slave chip, coupled to the first through line, wherein the slave chip includes a circuit that is disabled and receives the second voltage, during a period in which the predetermined operation is performed.

10. The semiconductor integrated circuit of claim 9, wherein the master chip includes:
    a first buffer circuit coupled to a first power line that is supplied with the first voltage,
    wherein the first supply circuit supplies the second voltage to the first through line in response to a control signal that indicates whether the master chip and the slave chip are stacked.

11. The semiconductor integrated circuit of claim 10, wherein the master chip further includes a first driving circuit that supplies a third voltage to the first power line during a power-up period in response to a power-up signal.

12. The semiconductor integrated circuit of claim 9, wherein the slave chip includes:
    a second buffer circuit coupled to a second power line that is supplied with the second voltage; and
    a second supply circuit that supplies the second voltage to a second through line in response to a control signal indicating whether the master chip and the slave chip are stacked,
    wherein the circuit includes the second buffer circuit.

13. The semiconductor integrated circuit of claim 12, wherein the slave chip further includes an internal circuit that performs domain crossing of voltages using the second voltage and a third voltage having a different voltage level from the second voltage.

14. The semiconductor integrated circuit of claim 13, wherein the internal circuit includes a level shifter.

15. The semiconductor integrated circuit of claim 13, wherein the third voltage has the same voltage level as the first voltage.

16. The semiconductor integrated circuit of claim 12, wherein the slave chip further includes a second driving circuit that supplies a third voltage to the second power line during a power-up period in response to a power-up signal.

* * * * *